United States Patent
Sakamoto et al.

(10) Patent No.: US 6,241,838 B1
(45) Date of Patent: *Jun. 5, 2001

(54) METHOD OF PRODUCING A MULTI-LAYER CERAMIC SUBSTRATE

(75) Inventors: Sadaaki Sakamoto; Hirofumi Sunahara; Hiroshi Takagi, all of Shiga-ken; Yukio Sakabe, Kyoto, all of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,705

(22) Filed: Aug. 26, 1998

(30) Foreign Application Priority Data

Sep. 8, 1997 (JP) .................................................. 9-242306
Nov. 25, 1997 (JP) .................................................. 9-321856

(51) Int. Cl.$^7$ .................................................. B32B 31/26
(52) U.S. Cl. .................................... 156/89.17; 156/89.12; 156/89.16; 156/89.18; 29/25.42; 29/851
(58) Field of Search .................................... 428/209, 901; 156/89.12, 89.14, 89.16, 89.17, 89.18, 289; 29/851, 25.42

(56) References Cited

U.S. PATENT DOCUMENTS

| | | | |
|---|---|---|---|
| 4,650,923 | * | 3/1987 | Nishigaki et al. . |
| 4,748,085 | * | 5/1988 | Fukuda et al. . |
| 4,800,459 | * | 1/1989 | Takagi et al. . |
| 5,085,720 | * | 2/1992 | Mikeska et al. .................. 156/289 X |
| 5,130,067 | * | 7/1992 | Flaitz et al. . |
| 5,370,759 | * | 12/1994 | Hakotani et al. .................. 156/289 X |
| 5,456,778 | * | 10/1995 | Fukuta et al. . |
| 5,470,412 | * | 11/1995 | Fukuta et al. . |
| 5,661,882 | * | 9/1997 | Alexander . |
| 5,814,366 | * | 9/1998 | Fukuta et al. .................. 156/89.11 X |
| 6,008,981 | * | 12/1999 | Harada et al. . |
| 6,042,667 | * | 3/2000 | Adachi et al. .................... 156/89.12 |

FOREIGN PATENT DOCUMENTS

| | | |
|---|---|---|
| 196 28 680A1 | 1/1997 | (DE) . |
| 0581206A2 | 2/1994 | (EP) . |
| 0581294A2 | 2/1994 | (EP) . |
| 9-92978 | 4/1997 | (JP) . |
| 9-92983 | 4/1997 | (JP) . |

* cited by examiner

*Primary Examiner*—Curtis Mayes
(74) *Attorney, Agent, or Firm*—Ostrolenk, Faber, Gerb & Soffen, LLP

(57) ABSTRACT

A method of producing a multi-layer ceramic substrate involves the steps of preparing compact blocks including a raw ceramic functional material to be the passive component, preparing a raw composite laminated member having a plurality of laminated ceramic green sheets containing a ceramic insulating material and wiring conductors and preliminarily providing spaces in the inside such that the compact blocks fit into the spaces, arranging sheet type bases made from a raw ceramic not sintered at the baking temperature of the composite laminated member on the principal plane at both ends with respect to the lamination direction of the raw composite laminated member, baking the raw composite laminated member with the raw composite laminated member interposed by the sheet type bases so as to restrain the contraction at a temperature not more than about 1000° C., and eliminating the unsintered sheet type bases.

14 Claims, 2 Drawing Sheets

METHOD OF PRODUCING A MULTI-LAYER CERAMIC SUBSTRATE

BACKGROUND OF THE INVENTION

1. Field of the Invention

The present invention relates to a multi-layer ceramic substrate and a method of produce the multi-layer ceramic substrate. Specifically, it relates to a multi-layer ceramic substrate accommodating a passive component such as a capacitor and an inductor, and a method of producing the multi-layer ceramic substrate.

2. Description of the Related Art

In order to realize multi-functions, higher density and higher performance in a multi-layer circuit substrate such as a multi-layer ceramic substrate, it is effective to store sophisticated passive components in the multi-layer circuit substrate and apply a high density of wiring.

Multi-layer circuit substrates storing a passive component accordingly have been produced conventionally by various methods as follows:

First, there is a so-called thick film method where a dielectric paste is printed on green substrate sheets by thick film forming technology so that the green sheet can be laminated, pressed and baked for partially storing a capacitor inside the multi-layer ceramic substrate. However, the method is disadvantageous in the following points:

(1) Due to comparatively large irregularities in the paste film thickness and printing displacement, irregularities in the capacitor characteristics such as the capacity are comparatively large.

(2) Paste deformation generated in the pressing or baking step gives rise to irregularity in characteristics.

(3) Due to deterioration of the flatness in the printing step of the repetition of printing and lamination, it is difficult to increase the number of the laminations so that a large capacity can hardly be achieved in a capacitor.

Second, there is a method similar to the above-mentioned first method for producing a multi-layer circuit substrate with a resistor and a capacitor where a capacitor, resistor and the like are printed on the surface of a ceramic substrate with a thick film forming technology in multi-layers. However, similar to the above-mentioned first method, this method is disadvantageous in the following points:

(1) Characteristic irregularity due to the printing pattern displacement and the film thickness irregularity, (2) Capacity limitation due to the limitation in the number of the lamination, and (3) Flatness deterioration.

Third, there is a method of accommodating a dielectric member with a sheet form inside a multi-layer substrate as disclosed in Japanese Unexamined Patent Publication No. 59-17232. In this method, a dielectric sheet having the same area as the substrate is laminated interposed between substrate sheets, pressed, and baked. Accordingly, although problems including the characteristic irregularity such as capacity and limitation with respect to a larger capacity can be solved, the following problems come out:

(1) Due to the layer arrangement of the dielectric members inside the substrate, the device cannot be designed freely.

(2) Problems such as crosstalk of signals can be easily generated.

Fourth, there is a method of assembling a preliminarily sintered chip type ceramic passive component inside a laminated member comprising a plurality of ceramic green sheets as disclosed in Japanese Unexamined Patent Publication No. 61-288498. Although the problems in the above-mentioned first to third methods can be solved in this method, the contraction behavior in the X, Y, Z directions needs to be strictly controlled so that the materials which can be used as the ceramic is limited, and further the following problems are involved:

(1) Substrate flatness can be deteriorated easily.

(2) It is difficult to improve the size accuracy.

(3) It is difficult to provide minute wiring.

The methods for achieving high density wiring in a multi-layer circuit substrate include a method of pressing onto the upper and lower surfaces of a laminated member comprising a plurality of green sheets to be baked at a low temperature, green sheets which do not contract at the baking temperature of the laminated member, baking the same at a comparatively low temperature and eliminating the unsintered layer derived from the latter green sheets after baking (see Japanese Unexamined Patent Publication No. 4-243978 for example), and a method of further pressing the laminated member from above and below at the time of baking in the above-mentioned method (see Japanese Unexamined Patent Publication No. 5-503498 for example).

Since contraction can be hardly generated in the substrate surface direction, that is, in the X-Y direction in these methods, the size accuracy of the substrate obtained can be improved. Therefore, it is advantageous in that disconnection can hardly be generated even with high density wiring. However, these methods are not for providing a passive component inside the substrate.

As a fifth method for producing a multi-layer circuit substrate accommodating a passive component, Japanese Unexamined Patent Publication No. 9-92983 discloses a method combining the above-mentioned method of preventing the substrate contraction in the X-Y direction, and the method of partially accommodating a capacitor inside a multi-layer circuit substrate as a sheet or a thick film. This method is suitable for producing a multi-layer circuit substrate accommodating a passive component with high density wiring.

Since a dielectric member layer having the same area as the substrate is provided when the dielectric member part is formed with a sheet in the fifth method, the dielectric member layer is exposed at the substrate end face. Because the dielectric member layer needs to be dense in order to prevent moisture penetration, a sufficient density is achieved in the dielectric member layer by pressing the substrate from above and below at the time of baking. However, since the dielectric member layer shape is limited, problems are involved as in the above-mentioned third method using a dielectric member sheet in that:

(1) Due to the layer arrangement of the dielectric members inside the substrate, the device cannot be designed freely.

(2) Problems such as crosstalk of signals can be easily generated.

On the other hand, when the dielectric member part is formed with a thick film in the fifth method, a step of filling onto a concave part preliminarily provided in the substrate sheet corresponding to the area for forming the dielectric member part with a dielectric paste can be adopted. Although the problems of the thick film displacement and characteristics irregularity generated by the dielectric paste deformation problems in the thick film method mentioned above as the first method can be improved, the paste film thickness irregularity can be improved only to an insufficient degree. Furthermore, due to the difficulty of having the dielectric member part with a laminated structure, a problem of difficulty in obtaining a large capacity still remains.

SUMMARY OF THE INVENTION

Accordingly, in order to solve the above-mentioned various problems, an object of the present invention is to provide a method of producing a multi-layer ceramic substrate accommodating a passive component capable of achieving multi-functions, having a higher density and having a higher accuracy, and the multi-layer ceramic substrate obtained by the production method.

The present invention is to provide a multi-layer ceramic substrate comprising a laminated member having a plurality of ceramic layers made of a ceramic insulating material and a wiring conductor, and a passive component wired by the wiring conductor and stored in the laminated member, wherein the passive component is provided by sintering a compact block including a raw ceramic functional material to be the passive component, and the block accommodated in the laminated member integrally at the time of baking the laminated member.

Furthermore, the present invention is to provide a method of producing a multi-layer ceramic substrate comprising a laminated member having a plurality of ceramic layers made of a ceramic insulating material and a wiring conductor, and a passive component wired by the wiring conductor and stored in the laminated member, comprising the steps of preparing a compact block including a raw ceramic functional material to be the passive component, preparing a raw composite laminated member having a plurality of laminated ceramic green sheets containing a ceramic insulating material different from the ceramic functional material and the wiring conductor, preliminarily provided with a space in the inside such that the compact block is fitted into the space, and baking the raw composite laminated member.

In the above-mentioned method of producing a multi-layer ceramic substrate, it is preferable that the steps of arranging sheet type bases made from a raw ceramic not sintered at the baking temperature of the raw composite laminated member on the principal plane at both ends with respect to the lamination direction of the raw composite laminated member, baking the raw composite laminated member sandwiched between the sheet type bases, and eliminating the unsintered sheet type bases are further provided.

It is more preferable that the sheet type bases further contain a metal to be oxidized in the baking step, and the step of baking the above-mentioned raw composite laminated member is conducted in an atmosphere containing oxygen.

In the above-mentioned method of producing a multi-layer ceramic substrate, the above-mentioned metal can include at least one of Sc, Ti, V, Cr, Mn, Fe, Co, Ni, Cu, Zn, Si, Al, Mo and W.

Further, the weight ratio of the metal/ceramic of the sheet type base can be in the range from about 0.1/99.9 to 10/90. Moreover, the above-mentioned metal can be powdery.

The sheet type bases can further contain an organic vehicle including a resin which includes the metal as a side chain.

In the above-mentioned step of baking the raw composite laminated member, it is preferable that a load of not more than about 10 $kg/cm^2$ is applied on the sheet type base from above by placement of a plate type weight.

In the above-mentioned preferable embodiment, the sheet type bases can contain alumina or zirconia.

In the above-mentioned method of producing a multi-layer ceramic substrate, the composite laminated member can be baked at a temperature not more than about 1000° C.

Passive components to be used advantageously in a multi-layer ceramic substrate and a production method thereof according to the present invention include a capacitor and an inductor. A "passive component to be accommodated" in the present invention is not limited to one or more single members such as a capacitor and an inductor, but a composite member containing the single member such as an LC composite part combining a capacitor and an inductor is also included.

As the compact block, one having a laminated structure for forming a multi-layer internal conductor can be used advantageously.

It is preferable that the ceramic functional material in the compact block contains a crystallized glass or a mixture of a glass and a ceramic.

It is also preferable that the ceramic insulating material of the ceramic green sheets comprising the composite laminated member contains a glass or a mixture of a glass and a ceramic, with the weight ratio of the glass/the ceramic in the range of about 100/0 to 5/95.

It is preferable that the wiring conductor or the internal conductor contains at least one of Ag, Ag-Pt alloy, Ag-Pd alloy, Au, Ni, and Cu as the main component. It is further preferable that the sheet type bases contain a metal to be oxidized in the baking step, and the wiring conductor or the internal conductor contains at least one of Ag, Ag-Pt alloy, Ag-Pd alloy and Au as the main component when the step of baking the raw composite laminated member is conducted in an atmosphere containing oxygen.

In the multi-layer ceramic substrate and method of producing the multi-layer ceramic substrate according to the present invention, since the passive component comprising a compact block including a raw ceramic functional material of the passive component, accommodated in the laminated member, is sintered integrally at the time of baking the laminated member, the characteristics of the passive component itself can be determined substantially at the time of obtaining the compact block and the potential characteristics of the compact block can be maintained substantially after sintering. Accordingly, as long as the compact block is produced appropriately, the passive component accommodated in the multi-layer ceramic substrate can be obtained with the characteristics designed. Therefore, the multi-layer ceramic substrate as a whole can be provided with a stable quality. Hence a multi-layer ceramic substrate with multi-functions, higher density, higher accuracy and higher function can be realized easily.

Since the passive component is completely embedded inside the laminated member, a multi-layer ceramic substrate with high environmental resistance such as moisture resistance can be obtained.

Moreover, since the passive component can be disposed three-dimensionally in the multi-layer ceramic substrate, the device can be designed more freely, and the problem of the signal crosstalk can be avoided more effectively.

In the method of producing a multi-layer ceramic substrate according to the present invention, since a compact block including a raw ceramic functional material of the passive component is prepared, and a raw composite laminated member embedding the raw compact block is baked, the contraction behavior at the time of baking need not be controlled strictly compared with the case of baking with a passive component preliminarily baked is embedded so that the material to be used for the ceramic green sheets to be the laminated member can be selected from a wider range.

Moreover, since the space for fitting the compact block to be the passive component is provided preliminarily in the raw composite laminated member, the flatness of the obtained multi-layer ceramic substrate can be maintained preferably. Accordingly, since undesired deformation or disconnection of the wiring conductor can be prevented, high density wiring can be realized with high size accuracy without generating characteristics irregularity, and the number of laminations of the ceramic layers comprising the multi-layer ceramic substrate can be increased without causing a problem so that a higher function can be easily achieved in the multi-layer ceramic substrate.

Since the sheet type bases are not sintered in the step of baking the raw composite laminated member with the sheet type bases arranged on the principal plane at both ends with respect to the lamination direction of the raw composite laminated member, contraction cannot be generated substantially so that the contraction in the X-Y direction of the composite laminated member interposed by the sheet type bases can be restrained at the time of baking. Accordingly, the size accuracy of the multi-layer ceramic substrate can be further improved, and problems such as disconnection can be further prevented even with minute and high density wiring. Moreover, since the contraction in the X-Y direction can be restrained as mentioned above, the contraction behavior of the compact block and the ceramic green sheets can be easily coincided with each other at the time of baking so that the materials for the compact and the ceramic green sheets can be selected from a wider range.

Furthermore, when the raw sheet type bases contain a raw ceramic not sintered at the baking temperature and a metal to be oxidized in the baking step, pores which can be generated in the degreasing step can be filled advantageously so as to close the area where the ceramic particles can move in the sheet type bases owing to oxidization and expansion of the metal contained in the sheet type bases during the baking step. Accordingly, the sheet type bases do not generate substantial contraction during the baking step so that the contraction in the X-Y direction of the composite laminated member interposed by the sheet type bases can be restrained. Therefore, the size accuracy of the multi-layer ceramic substrate can be further improved and problems such as disconnection can be further prevented even with minute and high density wiring. Moreover, since the contraction in the X-Y direction can be restrained as mentioned above, the contraction behavior of the compact block and the ceramic green sheets can be easily coincided with each other at the time of baking the composite laminated member and the ceramic green sheets so that the materials for the compact and the ceramic green sheets can be selected from a wider range.

In the present invention, by using a metal in the sheet type bases including at least one of Sc, Ti, V, Cr, Mn, Fe, Co, Ni, Cu, Zn, Si, Al, Mo and W, with the weight ratio of the metal/the ceramic in the range from about 0.1/99.9 to 10/90, the metal can be oxidized at a baking temperature not more than about 1000° C., and further, the pores can be filled sufficiently by the metal oxide more easily.

Furthermore, in the present invention, by providing a metal in an organic vehicle to serve as a binder for the sheet type bases as a side chain of a resin, the metal can be selectively disposed at a position where the resin, which can generate pores, exists, and the pores can be filled with a metal oxide more effectively.

By placing a load of not more than about 10 kg/cm$^2$ on the sheet type base by, e.g., a plate type weight in the baking step, undesired deformation such as a slight warpage of the composite laminated member can be avoided advantageously.

With the compact block to be the passive component having a laminated structure for forming a multi-layer internal conductor, a high capacity can be obtained when the passive component is a capacitor, and a high inductance can be obtained when the passive component is an inductor.

In the present invention, where the ceramic functional material contains a crystallized glass or a mixture of a glass and a ceramic, with the ceramic insulating material of the ceramic green sheets comprising the composite laminated member containing a glass or a mixture of a glass an a ceramic, with the weight ratio of glass/ceramic in a range from about 100/0 to 5/95, the composite laminated member can be baked at a comparatively low temperature such as 1000° C. Therefore, a wiring conductor containing at least one of Ag, Ag-Pt alloy, Ag-Pd alloy, Au, Ni and Cu as the main component can be used without trouble. When the raw sheet type bases contains a ceramic not sintered at the baking temperature of the raw composite laminated member and a metal to be oxidized in the baking step, a wiring conductor containing at least one of Ag, Ag-Pt alloy, Ag-Pd alloy and Au as the main component can be used without trouble. Besides, a sheet type base containing alumina or zirconia, which is chemically stable and can be obtained comparatively easily, can be used.

Other features and advantages of the present invention will become apparent from the following description of the invention which refers to the accompanying drawings.

DESCRIPTION OF THE PREFERRED EMBODIMENT

Figure 1:
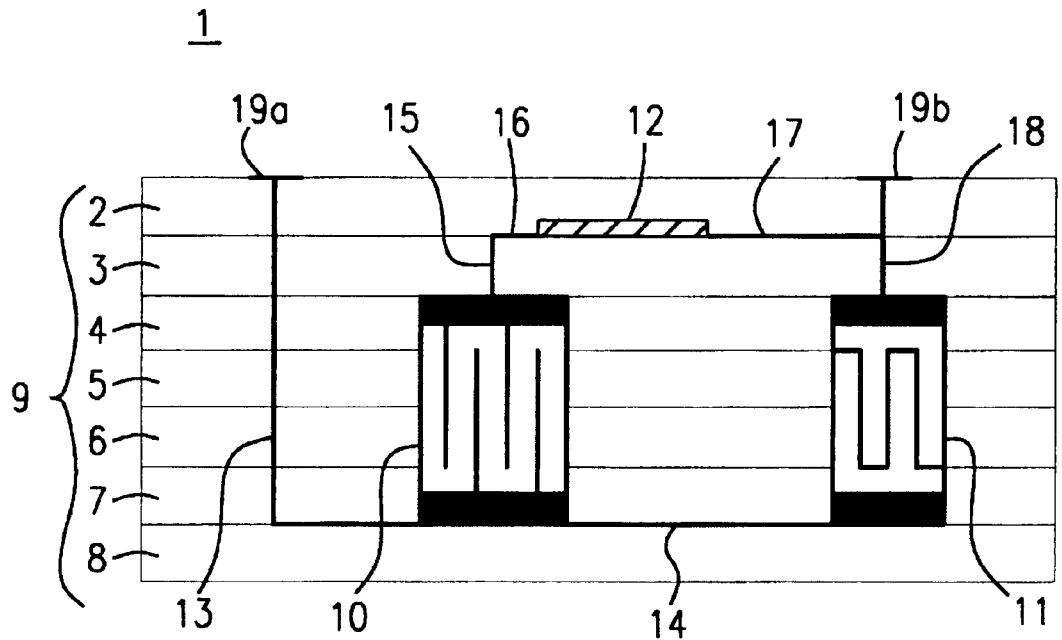
FIG. 1 is a schematic cross-sectional view of a multi-layer ceramic substrate 1 according to one embodiment of the present invention.
Figure 2:
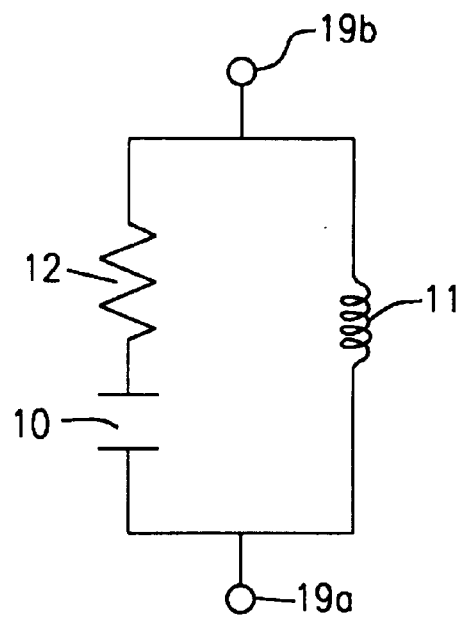
FIG. 2 is an equivalent circuit diagram of the multi-layer substrate 1 shown in FIG. 1.

A multi-layer ceramic substrate 1 shown in FIG. 1 comprises a laminated member 9 having a plurality of laminated ceramic layers made of a ceramic insulating material 2, 3, 4, 5, 6, 7 and 8. The laminated member 9 accommodates a capacitor 10, an inductor 11 and a resistor 12 as the passive components. Furthermore, the laminated member 9 accommodates wiring conductors 13, 14, 15, 16, 17 and 18 for wiring the capacitor 10, the inductor 11 and the resistor 12, and further, has external terminal conductors 19a and 19b on the outer surface. Accordingly, the multi-layer ceramic substrate 1 is provided with a circuit as shown in FIG. 2.

The multi-layer ceramic substrate 1 with the above-mentioned configuration can be produced as follows.

Figure 3:
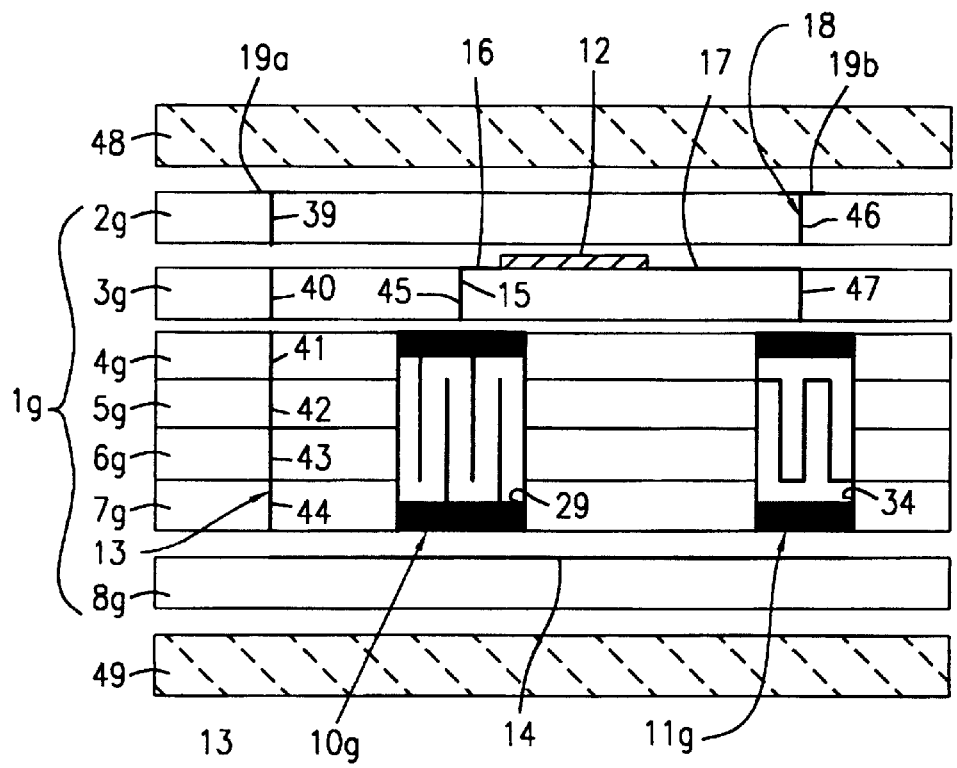
FIG. 3 is a cross-sectional view of ceramic green sheets 2g to 8g, compact blocks log and 11g, and sheet type bases 48 and 49, for explaining the method of producing the multi-layer ceramic substrate 1 shown in FIG. 1.
Figure 4:
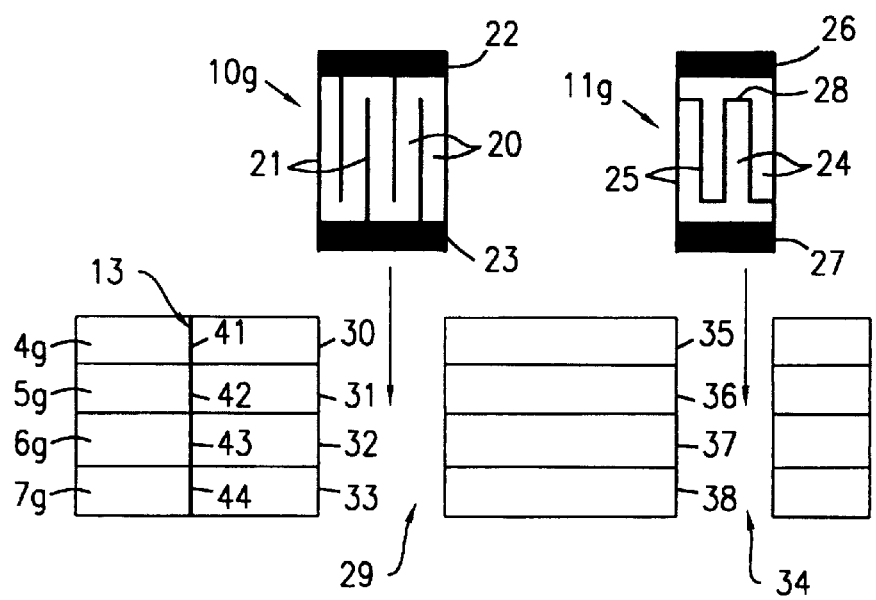
FIG. 4 is a cross-sectional view showing the ceramic green sheets 4g to 7g and the compact blocks log and 11g shown in FIG. 3 separately.

As shown in FIGS. 3 and 4, a compact block for a capacitor containing a raw ceramic functional material 10g to be capacitor 10 and a compact block for an inductor containing a raw ceramic functional material 11g to be the inductor 11 are prepared.

The compact block for capacitor 10g includes a ceramic dielectric member as the ceramic functional material so as to provide a laminated structure where multi-layer internal conductors 21 are formed via a raw dielectric sheet 20 containing the ceramic dielectric member. Terminal electrodes 22 and 23 are formed at end faces of the compact block 10 facing each other. The internal electrodes 21 are provided such that ones to be connected with the terminal electrode 22 at one side and ones to be connected with the terminal electrode 23 at the other side are arranged alternately as in an internal electrode in a known laminated ceramic capacitor.

The compact block for an inductor 11g includes a ceramic magnetic member as the ceramic functional material so as to provide a laminated structure where multi-layer internal conductors 25 are formed via a raw magnetic sheet 24 including the ceramic magnetic member. Terminal electrodes 26 and 27 are formed at end faces of the compact block 11g facing each other. The multi-layer internal electrodes 25 comprise a conductor path elongating in a coil-like manner while each of them is connected with a through conductor 28 for penetrating each magnetic sheet 24.

It is preferable that the compact blocks 10g and 11g can be baked at a temperature not higher than about 1000° C.

Accordingly, as the ceramic functional material for the dielectric sheet 20 and for magnetic sheet 24, that is, as the ceramic dielectric member and the ceramic magnetic member, a crystallized glass or a mixture of a glass and a ceramic can be used advantageously. More specifically, a dielectric sheet 20 prepared by forming a ceramic slurry obtained by mixing powders of barium titanate containing a slight amount of a borosilicate glass and an organic vehicle into a sheet-like shape by a doctor blade method can be used. On the other hand, a magnetic sheet 24 prepared by forming a ceramic slurry obtained by mixing powders of nickel zinc ferrite containing a slight amount of a borosilicate glass and an organic vehicle into a sheet-like shape by a doctor blade method can be used.

For forming the internal conductor 21, the terminal electrodes 22 and 23, internal conductor 25, terminal electrodes 26 and 27, and through conductor 28, a conductive paste containing at least one of Ag, Ag-Pt alloy, Ag-Pd alloy, Au, Ni and Cu as the main component can be used advantageously.

The internal electrodes 21 and 25 can be formed by applying the above-mentioned conductive paste onto the dielectric sheet 20 and the magnetic sheet 24 by screen printing a predetermined pattern.

In order to obtain the compact blocks 10g and 11g, it is preferable that a predetermined number of the dielectric sheets 20 where the internal conductor 21 is formed and a predetermined number of the magnetic sheets 24 where the internal conductor 25 is formed are laminated and pressed. In the pressing step, for example, a 100 kg/c pressure is applied by a hydraulic press.

On the other hand, the ceramic green sheets 2g, 3g, 4g, 5g, 6g, 7g and 8g to be ceramic layers 2 to 8 are prepared. The ceramic insulating material for ceramic green sheets 2g to 8g is different from the ceramic functional material for the above-mentioned compact block 10g or 11g.

Ceramic green sheets 2g to 8g for the compact block for a capacitor 10g and the compact block for an inductor 11g, resistor 12, wiring conductors 13 to 18, and the external terminal conductors 19a and 19b are preliminarily processed or treated.

More specifically, a series of through holes 30, 31, 32 and 33 for a space 29 to accommodate the compact block for a capacitor 10g, and a series of through holes 35, 36, 37 and 38 for a space 34 to accommodate the compact block for an inductor 11g are provided preliminarily in ceramic green sheets 4g, 5g, 6g and 7g.

Further, a series of through holes 39, 40, 41, 42, 43 and 44 for the wiring conductor 13 are provided preliminarily to the ceramic green sheets 2g, 3g, 3g, 5g, 6g and 7g. A through hole 45 for the wiring conductor 15 is provided in ceramic green sheet 3g. A series of through holes 46 and 47 for wiring conductor 18 are preliminarily provided in the ceramic green sheets 2g and 3g. A conductive paste for wiring conductors 13, 15 and 18 is applied to through holes 39 to 47.

A conductive paste for the external terminal conductor 19a and 19b is applied to the ceramic green sheet 2g by screen printing such that the conductive paste can be connected with the conductive paste in through holes 39 and 46.

A conductive paste for wiring conductors 16 and 17 is applied to the ceramic green sheet 3g by screen printing such that the conductive paste can be connected with the conductive paste in through holes 45 and 47. A thick film resistor paste for resistor 12 is applied such that the conductive paste for the wiring conductors 16 and 17 can be connected thereto. As the resistor paste, a mixture of powders of lutetium oxide containing a slight amount of borosilicate glass and an organic vehicle can be used advantageously.

Moreover, a conductive paste for wiring conductor 14 is provided to the ceramic green sheet 8g by screen printing such that it is connected to the conductive paste inside through hole 44 and is exposed in the spaces 29 and 34 when ceramic green sheets 2g to 8g are laminated, that is, it can be connected with the terminal electrodes 23 and 27 of the compact blocks 10g and 11g.

As the conductive paste for wiring conductors 13 to 18 and the external terminal conductors 19a and 19b, one containing at least one of Ag, Ag-Pt alloy, Ag-Pd alloy, Au, Ni and Cu as the main component can be used advantageously.

As the ceramic insulating material for ceramic green sheets 2g to 8g, one which can be baked at a temperature not more than about 1000° C. is preferably used. Examples thereof include a glass, and a mixture of a glass and a ceramic. In this case, the weight ratio of the glass/the ceramic can be selected in the range from about 100/0 to 5/95 because the baking temperature becomes higher than about 1000° C. with a glass/ceramic weight ratio smaller than about 5/95. Since a higher baking temperature narrows the selection material for the wiring conductor 13 to 18, it is not preferable.

More specifically, a ceramic slurry obtained by mixing borosilicate glass powders and alumina powders with an organic vehicle formed into a sheet-like shape by the doctor blade method can be used as the ceramic green sheets 2g to 8g. The ceramic green sheets 2g to 8g of such material can be baked at a comparatively low temperature of about 800 to 1000° C.

With the compact blocks log and 11g, and the ceramic green sheets 2g to 8g accordingly obtained, a raw composite laminated member 1g to become the multi-layer ceramic substrate 1 after baking can be produced as follows.

As shown in FIG. 4, the ceramic green sheets are laminated preliminarily. Compact blocks 10g and 11g are fitted into the spaces 29 and 34. At this time, the terminal electrodes 22, 23, 26 and 27 are exposed at the opening of the spaces 29 and 34. Then, a pressing step is conducted with, for example, a 500 kg/cm² hydraulic press so as to press the ceramic green sheets 4g to 7g. Accordingly, the closeness of ceramic green sheets 4g to 7g can be improved as well as the compact blocks 10g and 11g and the internal periphery surface of the spaces 29 and 34 can also be contacted closely.

Ceramic green sheets 2g, 3g and 8g are laminated above and below the above-mentioned ceramic green sheets 4g to 7g so as to obtain the raw composite laminated member 1g. The conductive paste inside through holes 39 to 44 forms a series of wiring conductors 13 and is connected to wiring conductor 14. The conductive paste in through hole 45 is connected to the terminal electrode 22 of compact block 10g. The conductive paste in through holes 46 and 47 forms a series of wiring conductors 18 and is connected to the terminal electrode 26 of compact block 11g. The terminal electrodes 23 and 27 of the compact blocks 10g and 11g are connected to the wiring conductor 14.

In this embodiment, sheet type bases 48 and 49 made from a raw ceramic which cannot be sintered at the baking temperature of the raw composite laminated member 1g are further prepared. Since the raw composite laminated member 1g can be baked at a temperature not more than about 1000° C. as long as its components, the compact blocks 10g and 11g and the ceramic green sheets 2g to 8g, can be baked at a temperature not more than about 1000° C., a material which cannot be sintered at 1000° C. can be used for the sheet type bases 48 and 49. A ceramic slurry obtained by mixing ceramic powders of alumina or zirconia and an organic vehicle into a sheet-like shape by a doctor blade method can be used advantageously to form sheet type bases 48 and 49.

For the raw sheet type bases 48 and 49, a type containing a ceramic which cannot be sintered at the baking temperature of the raw composite laminated member 1g and a metal which can be oxidized in the baking step can be prepared.

In this case, a conductive paste containing at least one of Ag, Ag-Pt alloy, Ag-Pd alloy and Au as the main component can be used advantageously for forming the internal conductor 21, the terminal electrodes 22 and 23, the internal conductor 25, the terminal electrodes 26 and 27, and the through conductor 28, and for providing the wiring conductors 13 to 18 and the external terminal conductors 19a and 19b.

The metal in the sheet type bases 48 and 49 can be in the state of metal powders as mentioned above, or in the state of a metal contained in the resin in the organic vehicle as a side chain.

Further, it is preferable that the metal to be in the sheet type bases 48 and 49 contains at least one of Sc, Ti, V, Cr, Mn, Fe, Co, Ni, Cu, Zn, Si, Al, Mo and W. It is more preferable that the metal/ceramic weight ratio contained in the sheet type bases 48, 49 is in the range from about 0.1/99.9 to 10/90.

The metal contained in the sheet type bases 48 and 49 is oxidized and expanded at about 1000° C. or lower in the atmosphere of the baking step. Accordingly, pores generated in the sheet type bases 48 and 49 in the degreasing step can be filled so as to close the area where the ceramic particles in the sheet type bases 48 and 49 can move. As a result, the sheet type bases 48 and 49 cannot contract substantially since force is applied in the contracting direction because the ceramic particles contained therein cannot move.

When the above-mentioned metal is not present, the sheet type bases slightly contract due to pores generated in the degreasing step and a slight irregularity of the dispersion of the pores, so that the contraction amount becomes irregular.

Although the above-mentioned fifth method of the prior art is advantageous in that the contraction in the substrate direction, that is, in the X-Y direction can be considerably smaller so that the contraction irregularity can be smaller and thus the size accuracy of the substrate can be comparatively high, contraction irregularity still remains and size accuracy is not sufficient when a higher size accuracy is required. More specifically, in general, when a green sheet is sintered, the contraction ratio is about 20%, with contraction irregularity, even when it is well controlled, of about 0.5% in terms of the standard deviation. On the other hand, the contraction ratio can be lowered to 0.1%, and the irregularity thereof to about 0.05% in terms of the standard deviation by this invention. However, when high density wiring requires a size accuracy higher than one corresponding to the contraction irregularity, the contraction irregularity is not sufficiently small.

The contraction irregularity generated in the fifth method mainly derives from the dispersion irregularity of pores generated in the dummy green sheet which does not contract at the sintering temperature of the green sheet for a substrate.

More specifically, during the so-called degreasing step where the temperature is raised from room temperature so as to decompose, evaporate, and eliminate the organic component in the green sheet, hollows, that is, pores, are produced at a position where the organic component existed in the green sheet substrate and the dummy green sheet so that a porous structure is provided in the green sheet substrate and dummy green sheet. With a further temperature rise for sintering the green sheet substrate, although the dummy green sheet itself does not contract at the substrate sintering temperature, it receives a contraction force in the substrate surface direction from the green sheet substrate. Due to the spaces provided as pores in the dummy green sheet, particles in the dummy green sheet slightly move in the above-mentioned contraction direction. As a result, the dummy green sheet slightly contracts along with the green sheet substrate.

If the dummy green sheet is baked while detached from the green sheet substrate, the dummy green sheet does not receive a force in the contracting direction, particles in the dummy green sheet do not move and thus the contraction ratio thereof can be substantially 0%.

The phenomenon caused by the contraction force applied on the particles in the dummy green sheet from the green sheet substrate is derived from the space provided as the pores generated in the degreasing step, that is, room for moving. However, since the pores in the dummy green sheet are dispersed in a slightly irregular state, the moving amount of the particles becomes irregular so that the contraction amount of the dummy green sheet becomes irregular, and thus the contraction amount of the green sheet for a substrate becomes irregular.

On the other hand, when an appropriate amount of a metal is present, as in this embodiment, the pores can be filled with a metal oxide even if the pores are dispersed with a slight irregularity, and as a result, the contraction of the sheet type bases 48 and 49 can be eliminated so that the irregularity is eliminated accordingly.

In order to fill the pores with a metal oxide, it is effective to place the metal selectively at the position where a resin, as the organic substance cause of the pores, exists. In light of this point, it is more preferable that the metal be a side chain in the resin contained in the organic vehicle, which serves as a binder in the sheet type bases 48 and 49.

It is preferable that the weight ratio of the metal/the ceramic contained in the sheet type bases 48 and 49 is in the range from about 0.1/99.9 to 10/90 because the pores cannot be filled sufficiently with the metal oxide with a smaller amount of the metal, but on the other hand, the oxidization expansion amount of the metal exceeds the volume of the pores so that the porous structure of the sheet type bases 48 and 49 is ruined with a larger amount of the metal.

The raw sheet type bases 48 and 49 are arranged on the principal planes at both ends of the raw composite laminated member 1g with respect to the lamination direction, that is, on the upper and lower principal planes. Then, the raw composite laminated member 1g is pressed with sheet type bases 48 and 49. For the pressing operation, for example, a 1000 kg/cm$^2$ hydraulic press can be used.

The raw composite laminated member 1g is baked in the atmosphere at about 900° C. while being interposed between the raw sheet type bases 48 and 49.

When raw sheet type bases containing a ceramic not sintered at the baking temperature of the raw composite laminated member 1g and a metal which can be oxidized in the baking step are prepared as the raw sheet type bases 48 and 49, they can be baked at about 900° C. in an atmosphere containing oxygen. It is preferable to apply a load not more than 10 kg/cm$^2$ in the baking step by placing a plate-like weight on the upper sheet type base 48 because undesired deformation of the composite laminated member 1g such as slight warpage can be avoided by the load in the baking step. Since the effect is substantially the same as the case of 10 kg/cm$^2$ as a load more than 10 kg/cm$^2$, a load more than 10 kg/cm$^2$ is not required.

In the baking operation, the compact blocks 10g and 11g are baked so as to become the capacitor 10 and the inductor 11 in the sintered state, and the ceramic green sheets 2g to 8g become the laminated member 9 having a plurality of ceramic layers 2 to 8 in the sintered state. Accordingly, a multi-layer ceramic substrate 1 in the sintered state as a whole can be obtained.

Since the sheet type bases 48 and 49 are unsintered even after the baking step, they can be eliminated easily after cooling to obtain the desired multi-layer ceramic substrate 1.

Since sheet type bases 48 and 49 are not sintered in the baking step, they cannot contract substantially.

When raw sheet type bases containing a ceramic which cannot be sintered at the baking temperature of the raw composite laminated member 1g and a metal which can be oxidized in the baking step are prepared as the raw sheet type bases 48 and 49 as mentioned above, pores generated in the degreasing step are filled owing to oxidization and expansion of the metal contained in the sheet type bases 48 and 49 so that the area where ceramic particles in the sheet type bases 48 and 49 can move is closed. Therefore, the contraction can be further smaller.

Accordingly, the contraction of the composite laminated member 1g interposed between the sheet type bases 48 and 49 in the X-Y direction, that is, in the principal plane direction of the ceramic green sheets 2g to 8g can be advantageously restrained at the time of baking. Therefore, the size accuracy of the multi-layer ceramic substrate 1 can be higher, and thus problems such as disconnection can be further prevented even with minute high density wiring as wiring conductors 13 to 18. The capacitor 10, the inductor 11 and the resistor 12 show the designed characteristics.

Furthermore, since the contraction is restrained in the X-Y direction, the contraction behavior of the compact blocs log and llg and the ceramic green sheets 2g to 8g coincide with each other more easily at the time of baking and the materials for the compact blocks 10g and 1g and the ceramic green sheets 2g to 8g can be selected from a further wider range.

Although the present invention has been explained with reference to the embodiment shown in the drawings, various modification can be adopted within the range of the invention.

The circuit design adopted in the multi-layer ceramic substrate 1 shown in the drawings is merely a typical example for facilitating understanding of the present invention, and thus the present invention can be adopted equally in multi-layer ceramic substrates having various kinds of circuit designs.

Moreover, the compact blocks are not limited to a single member of a capacitor or an inductor, but a compact block of LC composite parts can be used as well.

Although the spaces 29 and 34 for fitting the compact blocks 10g and 11g are provided as through holes 30 to 33 and 35 to 38 in the ceramic green sheets 4g to 7g in the above-mentioned embodiment, a space for fitting a compact block can be formed as a concave part provided in a specific ceramic green sheet depending upon the size or the shape of the compact block.

While the invention has been particularly shown and described with reference to preferred embodiments thereof, it will be understood by those skilled man in the art that the forgoing and other changes in form and details may be made therein without departing from the spirit of the invention.

What is claimed is:

1. A method of producing a multi-layer ceramic substrate comprising a laminated member comprising a plurality of ceramic layers of a ceramic insulating material and a wiring conductor, and a passive component connected to the wiring conductor and stored in the laminated member, comprising the steps of:

providing a compact block comprising a ceramic functional material adapted to become the passive component;

providing a composite laminated member comprising a wiring conductor and plurality of laminated ceramic green sheets of a ceramic insulating material different from the ceramic functional material, said composite laminated member having an interior space adapted to receive the compact block;

positioning said compact block in said space;

after said positioning, positioning a sheet base, of a ceramic which does not sinter at the baking temperature of the composite laminated member and an oxidizable metal, on opposing principal planes of the composite laminated member at both ends with respect to the lamination direction of the raw composite laminated member;

baking the resulting composite laminated member with the composite laminated member interposed between the sheet bases in an atmosphere containing oxygen; and thereafter eliminating the unsintered sheet bases.

2. The method of producing a multi-layer ceramic substrate according to claim 1, wherein the metal is at least one member selected from the group consisting of Sc, Ti, V, Cr, Mn, Fe, Co, Ni, Cu, Zn, Si, Al, Mo and W.

3. The method of producing a multi-layer ceramic substrate according to claim 2, wherein the weight ratio of metal/ceramic in the sheet bases is about 0.1/99.9 to 10/90.

4. The method of producing a multi-layer ceramic substrate according to claim 3, wherein the metal in the sheet base is in powder form.

5. The method of producing a multi-layer ceramic substrate according to claim 3, wherein the sheet base comprises an organic vehicle including an oxidizable metal containing resin.

6. The method of producing a multi-layer ceramic substrate according to claim 1, wherein a load of not more than about 10 kg/cm$^2$ is applied on at least one sheet base.

7. The method of producing a multi-layer ceramic substrate according to claim 6, wherein the composite laminated member is baked at a temperature not more than about 1000° C.

8. The method of producing a multi-layer ceramic substrate according to claim 7, wherein the compact block comprises an internal conductor and wherein at least one of the wiring conductor and internal conductor comprises at least one member selected from the group consisting of Ag, Ag-Pt alloy, Ag-Pd alloy, Au, Ni and Cu.

9. The method of producing a multi-layer ceramic substrate according to claim 1, wherein the composite laminated member is baked at a temperature of not more than about 1000° C.

10. The method of producing a multi-layer ceramic substrate according to claim 9, wherein the compact block comprises an internal conductor and wherein at least one of the wiring conductor and internal conductor comprises at least one member selected from the group consisting of Ag, Ag-Pt alloy, Ag-Pd alloy, Au, Ni and Cu.

11. The method of producing a multi-layer ceramic substrate according to claim 10, wherein the compact block comprises a crystallized glass or a mixture of glass and ceramic.

12. The method of producing a multi-layer ceramic substrate according to claim 11, wherein the sheet base comprises at least one of alumina and zirconia.

13. The method of producing a multi-layer ceramic substrate according to claim 10, wherein the ceramic green sheet is glass and ceramic in a weight ratio of about 100/0 to 5/95.

14. The method of producing a multi-layer ceramic substrate according to claim 13, wherein the compact block comprises a laminate with multi-layer internal conductors therein.

* * * * *